(12) United States Patent
Morgan et al.

(10) Patent No.: US 6,982,921 B2
(45) Date of Patent: Jan. 3, 2006

(54) MULTIPLE CONFIGURATION MULTIPLE CHIP MEMORY DEVICE AND METHOD

(75) Inventors: Donald M. Morgan, Meridian, ID (US); Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 10/961,576

(22) Filed: Oct. 8, 2004

(65) Prior Publication Data

US 2005/0083763 A1    Apr. 21, 2005

Related U.S. Application Data

(62) Division of application No. 10/355,781, filed on Jan. 29, 2003, now Pat. No. 6,882,590.

(51) Int. Cl.
*G11C 8/00* (2006.01)

(52) U.S. Cl. ............................. 365/230.03; 365/230.08

(58) Field of Classification Search ........... 365/230.03, 365/230.08, 230.01, 201, 63, 51, 52
See application file for complete search history.

(56) References Cited

U.S. PATENT DOCUMENTS

| | | | |
|---|---|---|---|
| 5,360,992 A | 11/1994 | Lowrey et al. ............. 257/666 |
| 5,526,506 A | 6/1996 | Hyatt ........................... 395/438 |
| 5,717,647 A | 2/1998 | Hush et al. ............. 365/230.05 |
| 5,719,812 A | 2/1998 | Seki et al. ................... 365/194 |
| 5,952,845 A | 9/1999 | Merritt ......................... 326/38 |
| 6,141,286 A | 10/2000 | Vo et al. ................. 365/230.03 |
| 6,163,836 A | 12/2000 | Dowling ....................... 712/37 |
| 6,166,942 A | 12/2000 | Vo et al. ....................... 365/63 |
| 6,169,684 B1 | 1/2001 | Takahashi et al. ............ 365/49 |
| 6,175,891 B1 | 1/2001 | Norman et al. ............... 711/5 |
| 6,246,615 B1 | 6/2001 | King et al. ................. 365/200 |
| 6,279,068 B2 | 8/2001 | Brigati et al. ............... 711/100 |
| 6,324,602 B1 | 11/2001 | Chen et al. ................... 710/68 |
| 6,330,645 B1 | 12/2001 | Harriman .................... 711/151 |
| 6,353,549 B1 | 3/2002 | Merritt ......................... 365/51 |
| 6,388,312 B2 * | 5/2002 | Lee ............................. 257/678 |
| 6,396,729 B1 | 5/2002 | Norman et al. ............... 365/63 |
| 6,542,953 B2 | 4/2003 | Porterfield .................. 710/305 |
| 6,549,963 B1 | 4/2003 | Sayles ........................ 710/104 |
| 6,567,335 B1 | 5/2003 | Norman et al. ........ 365/230.06 |
| 6,615,325 B2 | 9/2003 | Mailloux et al. ........... 711/154 |
| 6,684,314 B1 | 1/2004 | Manter ....................... 711/200 |
| 6,711,050 B2 * | 3/2004 | Sadakata .................... 365/149 |
| 6,725,316 B1 | 4/2004 | Gans .......................... 710/307 |

* cited by examiner

*Primary Examiner*—Anh Phung
(74) *Attorney, Agent, or Firm*—Dorsey & Whitney LLP

(57) ABSTRACT

A memory integrated circuit can be used either alone or as a pair to provide a memory device having twice the capacity of the single integrated circuit. The larger capacity memory device is addressed using an extra row address bit. The extra row address bit is used either to alternately enable each of the memory integrated circuits in one configuration or is remapped to become an extra column address bit in another configuration.

13 Claims, 4 Drawing Sheets

MULTIPLE CONFIGURATION MULTIPLE CHIP MEMORY DEVICE AND METHOD

CROSS-REFERENCE TO RELATED APPLICATION

This application is a divisional of U.S. patent application Ser. No. 10/355,781, filed Jan. 29, 2003, now U.S. Pat. No. 6,882,590, issued on Apr. 19, 2005.

TECHNICAL FIELD

This invention relates to memory devices, and, more particularly, to a device and method for combining several relatively low capacity integrated memory devices to provide a relatively high capacity memory device.

BACKGROUND OF THE INVENTION

Memory devices, such as dynamic random access memory ("DRAM") devices are generally characterized by several parameters, the most important of which is their storage capacities. The storage capacity of a memory device is generally expressed as a number of bits or bytes, such as a 256 megabit ("Mb") memory device. Generally, data can be read from and written to a memory device having a specific capacity in a variety of configurations. In each configuration, each column address accesses a specific number of bits. For example, data can be read from and written to a 512 Mb memory device in the form of 128 million "nibbles" each consisting of 4 bits (128 Meg×4 bits=512 Mb), 64 million "bytes" each consisting of 8 bits (64 Meg×8 bits=512 Mb), or 32 million "words" each consisting of 16 bits (32 Meg×16 bits=512 Mb). In the 128 Meg×4 configuration, 4 bits are accessed by each column address. In the 64 Meg×8 configuration, 8 bits are accessed by each column address. Finally, in the In the 32 Meg×16 configuration, 16 bits are accessed by each column address. The manner in which the memory device must be addressed will therefore differ depending upon the configuration selected. The addressing requirements for each of the above-described configurations of the 512 Mb memory device is shown in the following Table 1:

TABLE 1

|  | 128 Meg × 4 | 64 Meg × 8 | 32 Meg × 16 |
| --- | --- | --- | --- |
| Configuration | 32 Meg × 4 × 4 banks | 16 Meg × 8 × 4 banks | 8 Meg × 16 × 4 banks |
| Row Addressing | 8 K (A0–A12) | 8 K (A0–A12) | 8 K (A0–A12) |
| Bank Addressing | 4 (BA0, BA1) | 4 (BA0, BA1) | 4 (BA0, BA1) |
| Column Addressing | 4 K (A0–A9, A11, A12) | 2 K (A0–A9, A11) | 1 K (A0–A9) |

It can be seen from the above Table 1 that the row and bank addressing remains the same regardless of the configuration selected. However, since the number of bits accessed for each column address varies with the selected configuration, the number of column addresses, and hence the required number of column address bits, varies with the selected configuration. For the 128 Meg×4 configuration, there are 4,000 column addresses requiring 12 column address bits, for the 64 Meg×8 configuration, there are 2,000 column addresses requiring 11 column address bits, and for the 32 Meg×16 configuration, there are 1,000 column addresses requiring 10 column address bits.

The addressing requirements for corresponding configurations for a proposed 1024 Mb memory device is shown in the following Table 2:

TABLE 2

|  | 256 Meg × 4 | 128 Meg × 8 | 64 Meg × 16 |
| --- | --- | --- | --- |
| Configuration | 64 Meg × 4 × 4 banks | 32 Meg × 4 × 4 banks | 16 Meg × 4 × 4 banks |
| Row Addressing | 16 K (A0–A13) | 16 K (A0–A13) | 16 K (A0–A13) |
| Bank Addressing | 4 (BA0, BA1) | 4 (BA0, BA1) | 4 (BA0, BA1) |
| Column Addressing | 4 K (A0–A9, A11, A12) | 2 K (A0–A9, A11) | 1 K (A0–A9) |

As can be seen from Table 2, the addressing requirements for a 1024 Mb memory device are identical to the addressing requirements for the 512 Mb memory device except that the 1024 Mb memory device has twice as many row addresses (16 k rather than 8 k) and thus requires an additional row address bit, i.e., 14 row address bits rather than just 13 row address bits.

Unfortunately, a single chip 1024 Mb memory device is not currently available. However, it would be desirable to meet the current demand for a single chip 1024 Mb memory device by combining two of the 512 Mb memory devices in a single package and operating them in combination. However, it does not seem possible to combine the 512 Mb memory devices in this manner because of the different addressing requirements of the 1024 Mb memory devices compared to the 512 Mb memory devices. More specifically, the 512 Mb memory devices could be accessed in a conventional manner by simply adding an extra column address bit. However, there are at least two reasons why this approach is not feasible. First, the need to operate the 1024 Mb memory device in different configurations means that the column address bits required will vary with the selected configuration. Second, as explained above, 14 row address bits (i.e., A0–A13) will be applied to the 1024 Mb memory device, but the 512 Mb memory devices used to implement the 1024 Mb memory device can use only 13 row address bits (i.e., A0–A12). Therefore, it does not seem feasible to implement a 1024 Mb memory device using two the 512 Mb memory devices, particularly in view of the need to operate the 1024 Mb memory device in various configurations.

The problem of implementing higher capacity memory devices by combining multiple lower capacity memory devices has been discussed in the context of implementing a 1024 Mb memory device by combining two 512 Mb memory devices. However, the same or similar problems exist in combining more than 2 lower capacity memory devices to provide a higher capacity memory device as well as in combining memory devices having storage capacities other than 512 Mb.

There is therefore a need for a memory device and method that provides a relatively large storage capacity obtained by combining several smaller capacity memory devices and still allows the memory device to be operated in a variety of configurations.

SUMMARY OF THE INVENTION

A memory integrated circuit having an internal row address bus for receiving M row address bits and an internal column address bus for receiving N column address bits can be used in a variety of configurations. A single memory integrated circuit can be used by coupling M externally applied row address bits to an internal row address bus of the memory integrated circuit, and coupling N externally applied column address bits to an internal column address bus of the memory integrated circuit. Several of the memory integrated circuits can be used in combination in either a first or a second configuration. In the first configuration, M of M+P externally applied row address bits are coupled to the internal row address bus of each of the memory integrated circuits, and N externally applied column address bits and P of the M+P externally applied row address bits are coupled to the internal column address bus of each of the memory integrated circuits. In the second configuraion, M of M+P externally applied row address bits are coupled to the internal row address bus of each of the memory integrated circuits, and N externally applied column address bits are coupled to the internal column address bus of each of the memory integrated circuits. P of the M+P externally applied row address bits are then used to selectively enable each of the memory integrated circuits.

DETAILED DESCRIPTION OF THE INVENTION

Figure 1:
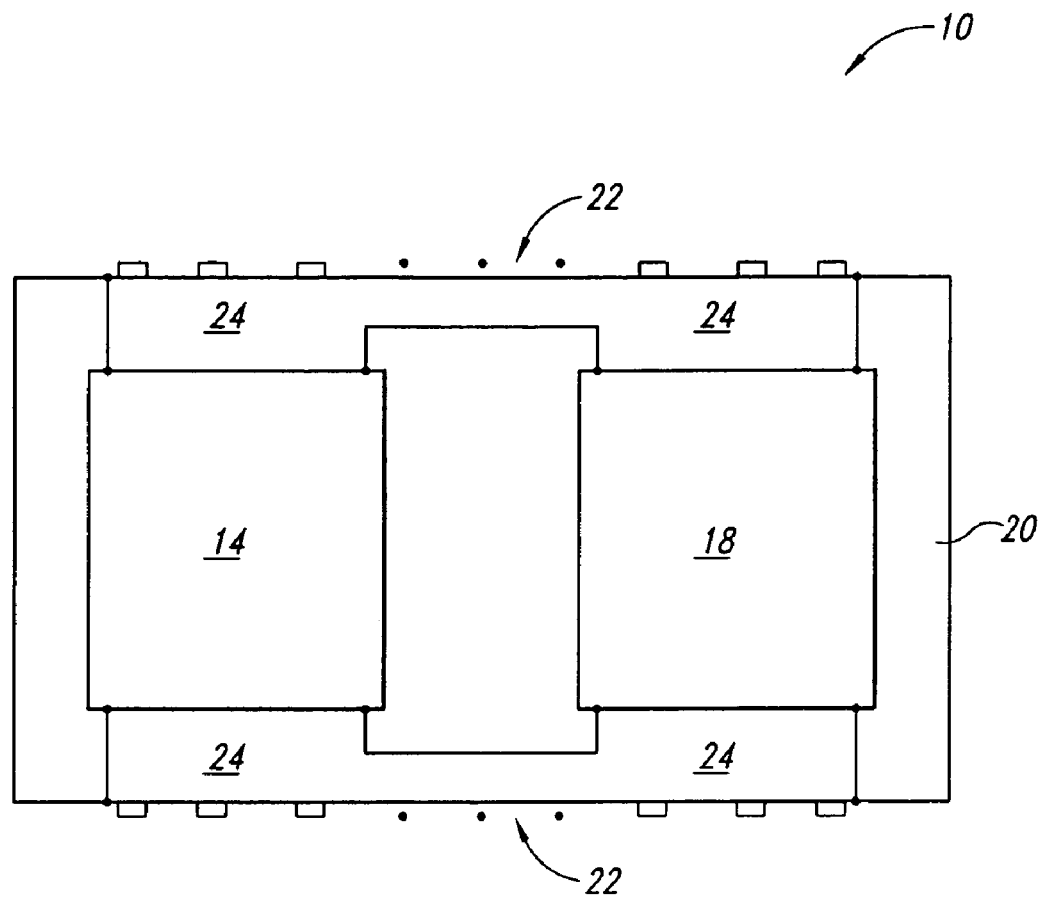
FIG. 1 is a plan view of a packaged integrated circuit memory device according to one embodiment of the invention.

FIG. 1 shows a memory device 10 according to one embodiment of the invention. The memory device includes two separate memory integrated circuits 14, 18 housed in a common package 20. Although the memory integrated circuits 14, 18 may be combined into a single package 20 as shown in FIG. 1, they are configured so they may be packaged individually to provide a memory device having half the storage capacity as the memory device 10.

The integrated circuits 14, 18 are coupled to plurality of externally accessible terminals 22 through conductors, generally indicated as 24. As shown in FIG. 1, the memory integrated circuits 14, 18 are dynamic random access memory ("DRAM") devices, although they could alternatively be other types of memory devices such as static random access memory ("SRAM") devices, FLASH memory devices, read only memory ("ROM") devices, or some other type of memory device. As described in greater detail below, the memory integrated circuits 14, 18 are each substantially conventional 512 Mb DRAM devices. However, it will be understood that more than 2 memory integrated circuits may be packaged together in accordance with the present invention. Also, the memory integrated circuits 14, 18 may have capacities that are either greater than or less than 512 Mb. Finally, although the memory integrated circuits 14, 18 shown in FIG. 1 are identical to each other, they may instead differ from each other in some respects.

Figure 2:
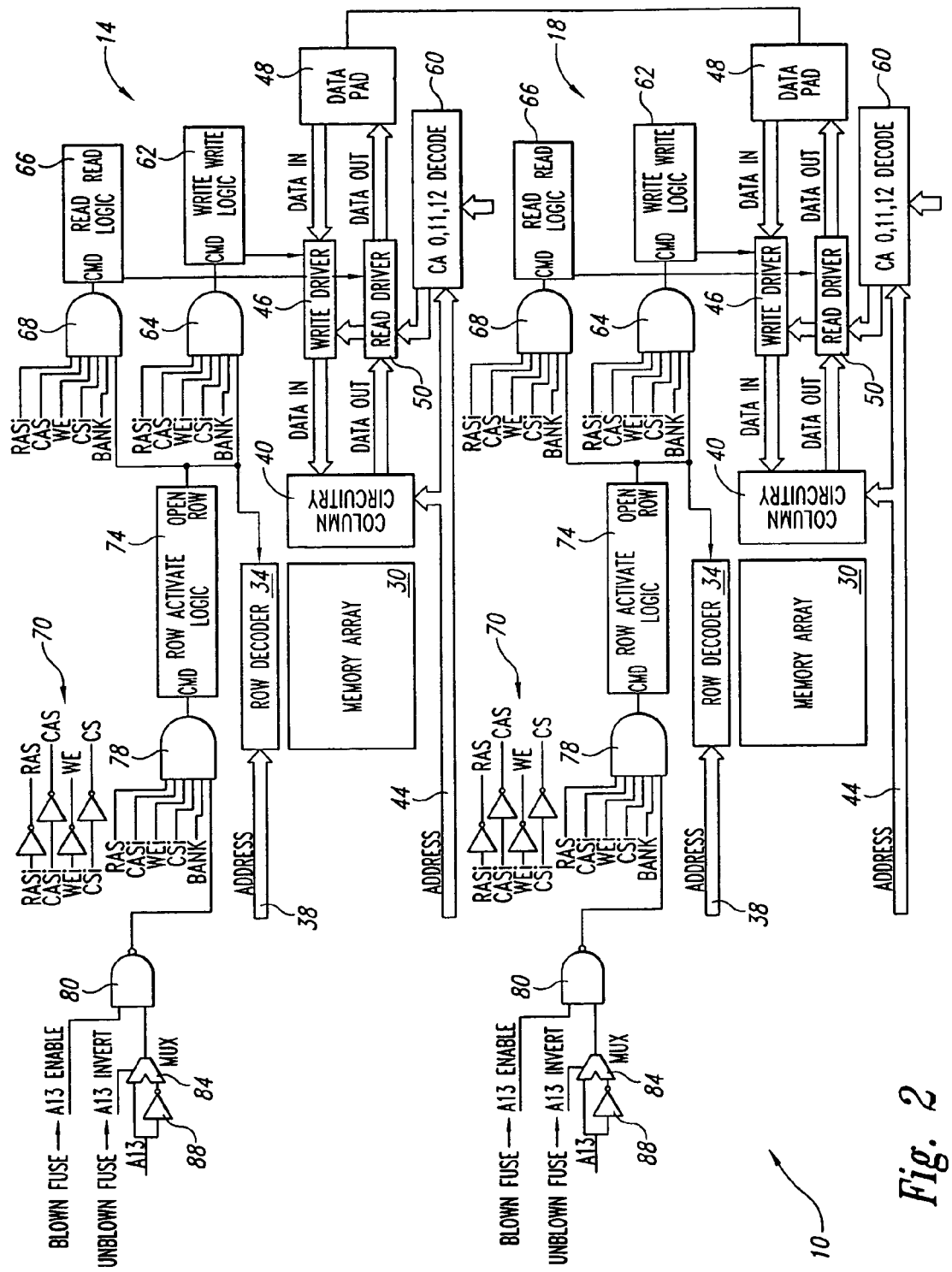
FIG. 2 is a block diagram of the memory device of FIG. 1 configured to couple either 4 or 8 bits to and from the memory device responsive to each column address.

The memory integrated circuits 14, 18 are shown in greater detail in FIG. 2. As mentioned above, the memory integrated circuits 14, 18 are each substantially conventional DRAM devices. Therefore, in the interest of brevity and clarity, only portions of the memory integrated circuits 14, 18 that are either needed to explain the embodiment of the invention or include circuitry not found in conventional DRAM devices are shown in FIGS. 1 and 2. With reference to FIG. 2, each of the memory integrated circuits 14, 18 includes 4 memory arrays 30 each having 128 Meg memory cells capable of storing 128 Mb of data.

As is well known in the art, the memory cells in the array 30 are arranged in rows and columns. The memory cells in each row are selected by activating a respective word line (not shown), and the memory cells in each column are selected by enabling respective input/output ("I/O") transistors (not shown), which couple data bits between the selected column and an internal data buffer (not shown).

The word lines in the array 30 are coupled to a row decoder 34, which receives a row address through an internal row address bus 38. The columns of memory cells in the array 30 are selected by column circuitry 40, which includes a column decoder (not shown) coupled to an internal column address bus 44. The column circuitry 40 also includes circuitry (not shown) that couples write data to memory cells in the array 30 from a write driver 46, which receives the write data from a data pad 48. The column circuitry 40 also includes circuitry (not shown) that couples read data from memory cells in the array 30 to a read driver 50, which applies the read data to the data pad 48. When the memory device 10 is configured to read or write either 4 or 8 bits responsive to each column address, the data pads 48 are coupled together. However, as explained below, only one of the memory integrated circuits 14, 18 is enabled at a time. As a result, there is no data contention at the data pads 48 during a read memory operation.

The write driver 46 is selectively enabled by a decoder 60 and by write logic circuitry 62, which is, in turn, enabled by an output from an AND gate 64. The read driver 50 is selectively enabled by the decoder 60 and read logic circuitry 66, which is, in turn, enabled by an output from an AND gate 68. Both of the AND gates 64, 68 receive a row address strobe ("RAS") signal, a column address strobe ("CAS") signal, a write enable ("WE") signal, a chip select ("CS") signal, and a bank select ("BANK") signal, all of which are conventional memory command signals. All of these signals except for the BANK signal are generated by coupling corresponding active low signals RASi, CASi, WEi, CSi through respective inverters 70. The AND gates

64, 68 also receive an OPEN ROW signal from row activate logic circuitry 74, which is active high whenever a row of memory cells in the array 30 has been activated. The row activate logic circuitry 74 is, in turn, enabled by a high output from an AND gate 78, which receives the previously described command signals and an output from a NAND gate 80. The NAND gate 80 is coupled to receive an $A_{13}$ enable signal and a signal from a multiplexer 84. The multiplexer couples either the $A_{13}$ row address bit or its compliment, which is generated by an inverter 88, to the input of the NAND gate 80.

In operation, when a row is to be opened in the memory array 30, the row activate logic circuit 74 is enabled by a high at the output of the AND gate 78 to generate an active high OPEN ROW signal. The active OPEN ROW signal activates row decoder 34 and enables the AND gates 64, 68 so that either the write logic circuitry 62 or the read logic circuitry 66 will be enabled depending upon whether WE is high for a write operation or WE is low for a read operation, respectively. The write logic circuitry 62 can then enable the write driver 46 and the read logic circuitry 66 can then enable the read driver 50 to couple data to or from the memory array, respectively.

The memory array 30 in each of the memory integrated circuits 14, 18 has 8,000 rows, which requires 13 row address bits $A_0$–$A_{12}$. The memory array 30 also has 16,000 columns. However, the number of column address bits required depends upon the number of columns selected by each column address. If 4 columns are selected by each column address (known as a "128 Meg×4" or "x/4" configuration), 4,000 column addresses (i.e., 16,000/4) are required, which requires 12 column address bits $A_0$–$A_9$, $A_{11}$, $A_{12}$. If 8 columns are selected by each column address (known as a "64 Meg×8" or "x/8" configuration), 2,000 column addresses (i.e., 16,000/8) are required, which requires 11 column address bits $A_0$–$A_9$, $A_{11}$. If 16 columns are selected by each column address (known as a "32 Meg×16" or "x/16" configuration), 1,000 column addresses (i.e., 16,000/16) are required, which requires only 10 column address bits $A_0$–$A_9$.

The 1 Gb memory device 10 produced by combining the memory integrated circuits 14, 18 is addressed as if it has 16,000 rows and 16,000 columns, which requires 14 row address bits $A_0$–$A_{13}$ and a number of column address bits depending upon the number of columns selected by each column address. If 4 columns are selected by each column address (known as a "256 Meg×4" or "x/4" configuration), then 4,000 column addresses are needed, which requires 12 column address bits $A_0$–$A_9$, $A_{11}$, $A_{12}$. If 8 columns are selected by each column address (known as a "128 Meg×8" or "x/8" configuration), then 2,000 column addresses are needed, which requires 11 column address bits $A_0$–$A_9$, $A_{11}$. If 16 columns are selected by each column address (known as a "64 Meg×16" or "x/16" configuration), then 1,000 column addresses are needed, which requires 10 column address bits $A_0$–$A_9$. The column addressing for the 1 GB memory device 10 is thus the same as the column addressing for the memory integrated circuits 14, 18 used in the memory device 10. However, twice as many row addresses, and thus one additional row address bit, is required for the 1 GB memory device 10 compared to the number of row addresses and row address bits required for the memory integrated circuits 14, 18 used in the memory device 10. This additional row address bit $A_{13}$ is coupled to the memory device 10 along with the other row address bits $A_0$–$A_{12}$ through respective externally accessible terminals 22 (FIG. 1).

When the memory device 10 is configured to couple either 4 or 8 bits to and from the memory device responsive to each column address as shown in FIG. 2, the high order row address bit A13 is used to enable either one but not both of the memory integrated circuits 14, 18. More specifically, when the memory device is configured to couple either 4 or 8 bits to and from the memory device responsive to each column address, the NAND gate 80 is enabled by biasing the $A_{13}$ enable signal high by suitable means, such as by blowing a fuse (not shown) or anti-fuse (not shown). The $A_{13}$ invert signal in the memory integrated circuit 14 is biased low so that the multiplexer 84 couples the high order row address bit $A_{13}$ to the NAND gate 80. The $A_{13}$ invert signal in the other memory integrated circuit 18 is biased high so that the multiplexer 84 couples the compliment of the high order row address bit $A_{13}$ to the NAND gate 80. As a result, when the $A_{13}$ row address bit is low, the AND gate 78 in the integrated circuit 14 is enabled so that only the row activate logic circuitry 74 in the integrated circuit 14 can be enabled. When the $A_{13}$ row address bit is high, the AND gate 78 in the integrated circuit 18 is enabled so that only the row activate logic circuitry 74 in the integrated circuit 18 can be enabled. As a result, the high order row address bit $A_{13}$ is used to selectively enable either the memory integrated circuit 14 or the memory integrated circuit 18.

Figure 3:
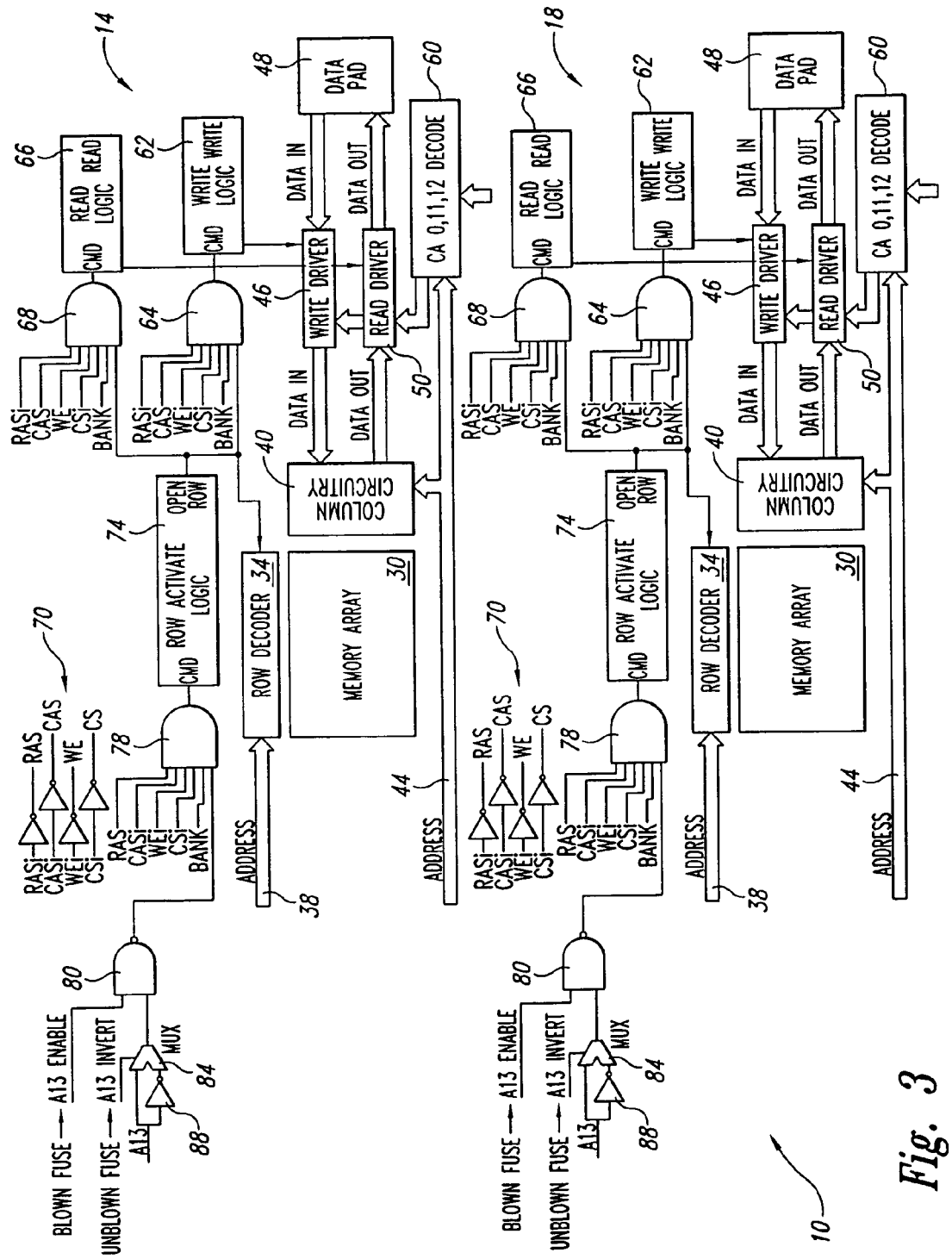
FIG. 3 is a block diagram of the memory device of FIG. 1 configured to couple 16 bits to and from the memory device responsive to each column address.

The memory device is configured as shown in FIG. 3 to couple 16 bits to and from the memory device responsive to each column address. In this x/16 configuration, the data pads 48 are not coupled to each other. Instead, the data pads 48 in the integrated circuit 14 supply 8 bits of data, and the data pads 48 in the integrated circuit 14 supply the remaining 8 bits of data selected by each column address. Also, the $A_{13}$ enable signal is biased low by suitable means so that the NAND gates 80 in both of the integrated circuit memory devices 14, 18 are continuously enabled regardless of the state of the $A_{13}$ row address bit. As a result, both of the integrated circuit memory devices 14, 18 are enabled at all times. The $A_{13}$ row address bit is then remapped to be a high order column address bit, and the individual memory integrated circuits 14, 18 are operated in the x/8 mode. More specifically, as shown in Table 1, when each of the 512 Mb memory integrated circuits 14, 18 are operating in the x/8 mode, 2,000 column addresses requiring $A_0$–$A_9$ and $A_{11}$ address bits are used. As shown in Table 2, when the 1 Gb memory device 10 is operating in the x/16 mode, 1,000 column addresses requiring only $A_0$–$A_9$ address bits are used. By remapping the $A_{13}$ row address bit to be an $A_{11}$ column address bit, the integrated circuits 14, 18 can operate in the x/8 mode to allow the memory device 10 to operate in the x/16 mode. In the x/8 mode, each of 4 arrays 30 in each of the integrated circuits 14, 18 can store 16 Meg 8 bit bytes for a total of 512 Mb stored in each integrated circuit 14, 18. Operating together, the integrated circuits 14, 18 can store 16 Meg 16 bit words in each of 4 memory arrays 30 for a total of 1,024 Mb stored in the memory device 10.

As previously explained, the memory integrated circuits 14, 18 can be used either together to implement a 1 Gb memory device or individually as a 512 Mb memory device. When the integrated circuits 14, 18 are used individually, the A13 enable signal is biased low to continuously enable the NAND gate 80, thereby continuously enabling the integrated circuits 14, 18 as explained above with reference to FIG. 3. Also, rather than coupling the $A_{11}$ column address bit to an externally accessible $A_{13}$ row address terminal, the $A_{11}$ column address bit is coupled to a respective externally accessible terminal to allow the memory integrated circuit 14, 18 to operate in either the 64 Meg×8 or the 128 Meg×4 configuration. In the same manner, the $A_{12}$ column address bit is coupled to a respective externally accessible terminal to allow the memory integrated circuit 14, 18 to operate in the 128 Meg×4 configuration.

Figure 4:
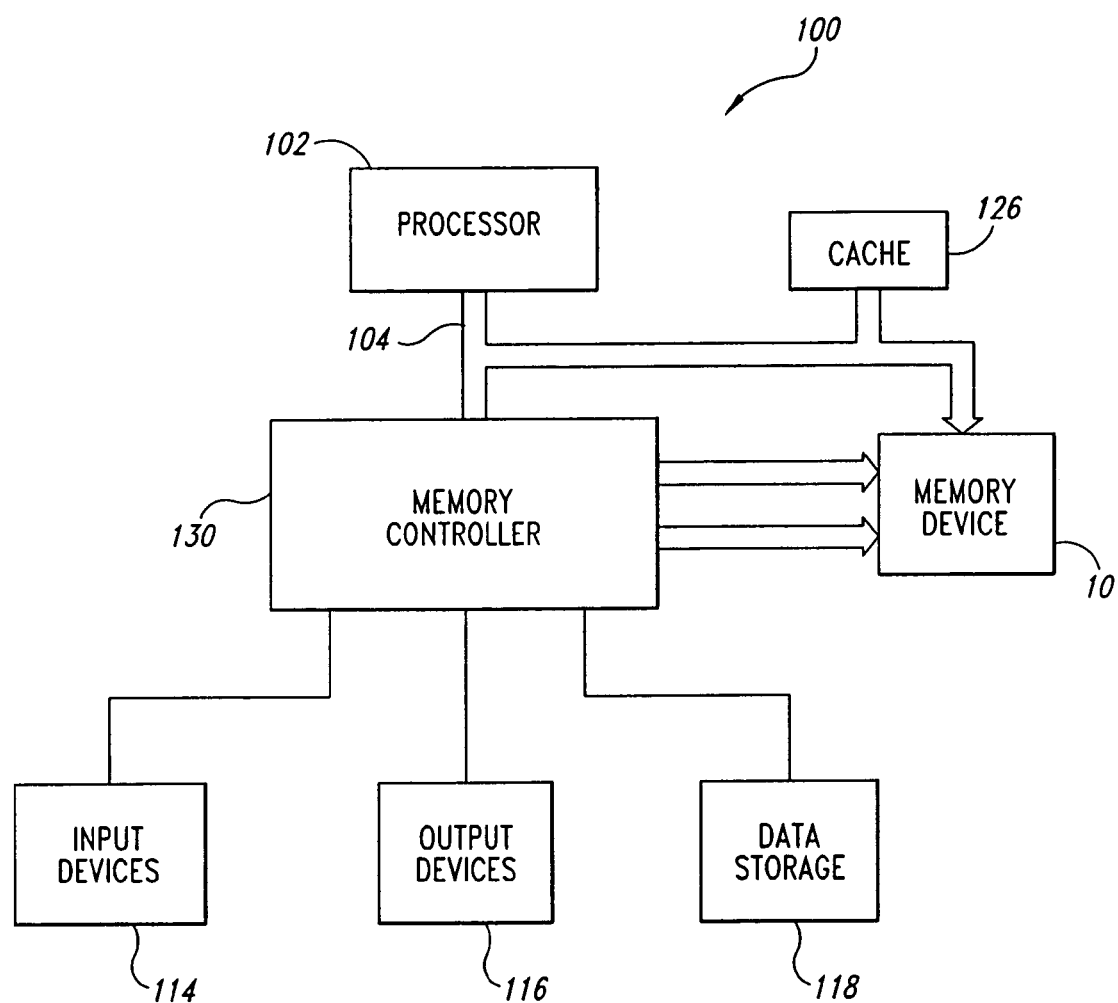
FIG. 4 is a block diagram of a computer system using the memory device of FIGS. 1–3.

The memory device 10 or some other memory device according to the invention may be used in any electronic circuit requiring a memory device having a high storage capacity, including the computer system 100 shown in FIG. 4. The computer system 100 includes a processor 102 for performing various computing functions, such as executing specific software to perform specific calculations or tasks. The processor 102 includes a processor bus 104 that normally includes an address bus, a control bus, and a data bus. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to store data or retrieve data from external storage media (not shown). Examples of typical storage devices 118 include hard and floppy disks, tape cassettes, and compact disk read-only memories (CD-ROMs). The processor 102 is also typically coupled to a cache memory 126, which is usually static random access memory ("SRAM"), and to the memory device 10 through a memory controller 130. The memory controller 130 includes an address bus coupling row addresses and column addresses to the memory device 10, and a control bus coupling command signals to the memory device 10. A data bus of the memory device 10 is coupled to the data bus of the processor 102, either directly or through the memory controller 130.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of using a memory integrated circuit having an internal row address bus for receiving M row address bits and an internal column address bus for receiving N column address bits, comprising:
   in a first use for the memory integrated circuit:
      packaging one of the memory integrated circuits in an integrated circuit package;
      coupling M externally applied row address bits to the integrated circuit package;
      coupling N externally applied column address bits to the integrated circuit package;
      coupling the M externally applied row address bits to the internal row address bus of the memory integrated circuit; and
      coupling the N externally applied column address bits to the internal column address bus of the memory integrated circuit; and
   in a second use for the memory integrated circuit:
      packaging at least two of the memory integrated circuits in a single integrated circuit package;
      coupling M+P externally applied row address bits to the integrated circuit package;
      coupling N externally applied column address bits to the integrated circuit package;
      coupling M of the M+P externally applied row address bits to the internal row address bus of each of the memory integrated circuits; and
      coupling the N externally applied column address bits and P of the M+P externally applied row address bits to the internal column address bus of each of the memory integrated circuits.

2. The method of claim 1 wherein each of the memory integrated circuits includes a plurality of data bus terminals receiving and transmitting respective data bits, and wherein the method further comprises:
   in the first use for the memory integrated circuit, coupling the data bus terminals of the memory integrated circuit to a first set of externally accessible data bus terminals; and
   in the second use for the memory integrated circuit, coupling the data bus terminals of each of the memory integrated circuits to respective sets of externally accessible data bus terminals.

3. The method of claim 1 wherein, in the second use for the memory integrated circuit, the memory integrated circuits are simultaneously enabled.

4. The method of claim 1, further comprising, in a third use for the memory integrated circuit:
   packaging at least two of the memory integrated circuits in a single integrated circuit package;
   coupling M+P externally applied row address bits to the integrated circuit package;
   coupling N externally applied column address bits to the integrated circuit package;
   coupling M of the M+P externally applied row address bits to the internal row address bus of each of the memory integrated circuits;
   coupling the N externally applied column address bits to the internal column address bus of each of the memory integrated circuits; and
   using P of the M+P externally applied row address bits to selectively enable each of the memory integrated circuits.

5. The method of claim 4 wherein each of the memory integrated circuits includes a plurality of data bus terminals receiving and transmitting respective data bits, and wherein the method further comprises:
   in the first use for the memory integrated circuit, coupling the data bus terminals of the memory integrated circuit to a first set of externally accessible data bus terminals;
   in the second use for the memory integrated circuit, coupling the data bus terminals of the memory integrated circuits to respective sets of externally accessible data bus terminals; and
   in the third use for the memory integrated circuit, coupling the corresponding data bus terminals of the memory integrated circuits to each other and to respective externally accessible data bus terminals.

6. The method of claim 1 wherein the memory integrated circuit comprises a dynamic random access memory integrated circuit.

7. The method of claim 1 wherein the variable P is equal to one.

8. The method of claim 7 wherein the variable M is equal to 13.

9. A method of using a memory integrated circuit having an internal row address bus for receiving M row address bits and an internal column address bus for receiving N column address bits, comprising:
   in a first use for the memory integrated circuit:

packaging one of the memory integrated circuits in an integrated circuit package;

coupling M externally applied row address bits to the integrated circuit package;

coupling N externally applied column address bits to the integrated circuit package;

coupling the M externally applied row address bits to the internal row address bus of the memory integrated circuit; and coupling the N externally applied column address bits to the internal column address bus of the memory integrated circuit; and in a second use for the memory integrated circuit:

packaging at least two of the memory integrated circuits in a single integrated circuit package;

coupling M+P externally applied row address bits to the integrated circuit package;

coupling N externally applied column address bits to the integrated circuit package;

coupling M of the M+P externally applied row address bits to the internal row address bus of each of the memory integrated circuits;

coupling the N externally applied column address bits to the internal column address bus of each of the memory integrated circuits; and using P of the M+P externally applied row address bits to selectively enable each of the memory integrated circuits.

10. The method of claim 9 wherein each of the memory integrated circuits includes a plurality of data bus terminals receiving and transmitting respective data bits, and wherein the method further comprises:

in the first use for the memory integrated circuit, coupling the data bus terminals of the memory integrated circuit to a first set of externally accessible data bus terminals; and in the second use for the memory integrated circuit, coupling the corresponding data bus terminals of the memory integrated circuits to each other and to respective externally accessible data bus terminals.

11. The method of claim 9 wherein the memory integrated circuit comprises a dynamic random access memory integrated circuit.

12. The method of claim 9 wherein the variable P is equal to one.

13. The method of claim 12 wherein the variable M is equal to 13.

* * * * *